US011251701B2

(12) United States Patent
Kuo et al.

(10) Patent No.: US 11,251,701 B2
(45) Date of Patent: Feb. 15, 2022

(54) CONTROL CHIP SUPPORTING CONSUMER ELECTRONICS CONTROL PROTOCOL AND HIGH VOLTAGE TOLERANT OUTPUT CIRCUIT THEREOF

(71) Applicant: Realtek Semiconductor Corporation, Hsinchu (TW)

(72) Inventors: Chun-I Kuo, Hsinchu (TW); Yi-Jang Wu, Hsinchu (TW); Chun-Ta Ho, Hsinchu (TW); Cheng-Yu Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/183,653

(22) Filed: Feb. 24, 2021

(65) Prior Publication Data

US 2021/0265910 A1 Aug. 26, 2021

(30) Foreign Application Priority Data

Feb. 26, 2020 (TW) .................................. 109106308

(51) Int. Cl.
| | |
|---|---|
| *G05F 1/10* | (2006.01) |
| *G05F 3/02* | (2006.01) |
| *H02M 3/155* | (2006.01) |
| *H02M 1/00* | (2006.01) |

(52) U.S. Cl.
CPC .......... *H02M 3/155* (2013.01); *H02M 1/0048* (2021.05)

(58) Field of Classification Search
CPC . G05F 1/465; G05F 1/56; G05F 1/575; G05F 3/30; G11C 5/147
USPC .................................................. 327/538–541
See application file for complete search history.

(56) References Cited

U.S. PATENT DOCUMENTS

| | | | | |
|---|---|---|---|---|
| 6,509,727 | B2* | 1/2003 | Fahrenbruch | G05F 1/565 323/316 |
| 6,781,417 | B1* | 8/2004 | Le | G05F 3/242 326/17 |
| 6,791,396 | B2* | 9/2004 | Shor | G05F 3/242 327/541 |
| 6,946,849 | B1* | 9/2005 | Lu | H03F 1/42 324/601 |
| 9,853,613 | B2 | 12/2017 | Quaglietta | |
| 2017/0331375 | A1* | 11/2017 | Chen | G05F 1/575 |

\* cited by examiner

*Primary Examiner* — Quan Tra
(74) *Attorney, Agent, or Firm* — Locke Lord LLP; Tim Tingkang Xia, Esq.

(57) ABSTRACT

A high voltage tolerant output circuit includes a boost circuit, a first bias circuit, and a buffer circuit. The boost circuit includes a first transistor and an output node. A first terminal of the first transistor is coupled with the output node. The first bias circuit is coupled with the output node and a control terminal of the first transistor, and for dividing the output voltage of the output node. The first bias circuit is further configured to transmit the divided output voltage to the control terminal of the first transistor. The buffer circuit is coupled with a second terminal of the first transistor, and for setting a first voltage of the second terminal of the first transistor. The output voltage is positive correlated to the first voltage, and a maximum value of the output voltage is higher than or equal to a maximum value of the first voltage.

20 Claims, 5 Drawing Sheets

CONTROL CHIP SUPPORTING CONSUMER ELECTRONICS CONTROL PROTOCOL AND HIGH VOLTAGE TOLERANT OUTPUT CIRCUIT THEREOF

RELATED APPLICATION

The present application claims priority to Taiwan Application Serial Number 109106308, filed Feb. 26, 2020, which is incorporated herein by reference in its entirety.

BACKGROUND

Technical Field

The present disclosure relates to a control chip. More particularly, the present disclosure relates to a high voltage tolerant output circuit of the control chip.

Description of Related Art

High definition multimedia interface (HDMI) is generally used in various household video and audio devices. In order to reduce numbers of remote control needed for user operation, a consumer electronics control (CEC) protocol is added to the HDMI standard, such that consumers may use a single remote controller to control various video and audio devices connected together through the HDMI. Since the control chip supporting the CEC protocol applies advanced process to reduce circuit area and save power, voltage endurance (e.g., 1.8 V) for components of the control chip may be lower than an output voltage (e.g., 3.3 V) for the CEC protocol specification.

SUMMARY

In order to solve the problem mentioned above, one aspect of the present disclosure is to provide a high voltage tolerant output circuit which includes a boost circuit, a first bias circuit, and a buffer circuit. The boost circuit comprises a first transistor and an output node, wherein a first terminal of the first transistor is coupled to the output node. The first bias circuit is coupled to the output node and a control terminal of the first transistor, and is configured to divide an output voltage of the output node and provide the output voltage divided by first bias circuit to the control terminal of the first transistor. The buffer circuit is coupled to a second terminal of the first transistor, and is configured to set a first voltage of the second terminal of the first transistor according to an input voltage, wherein the output voltage of the output node is positively correlated to the first voltage, and a maximum value of the output voltage is greater than or equal to a maximum value of the first voltage.

Some aspects of the present disclosure provide a control chip supporting consumer electronics control protocol comprising a high voltage tolerant output circuit, in which the high voltage tolerant output circuit includes a boost circuit, a first bias circuit, and a buffer circuit. The boost circuit comprises a first transistor and an output node, wherein a first terminal of the first transistor is coupled to the output node. The first bias circuit is coupled to the output node and a control terminal of the first transistor, and is configured to divide an output voltage of the output node and provide the output voltage divided by the first bias circuit to the control terminal of the first transistor. The buffer circuit is coupled to a second terminal of the first transistor, and is configured to set a first voltage the second terminal of the first transistor according to an input voltage, wherein the output voltage of the output node is positively correlated to the first voltage, and a maximum value of the output voltage is greater than or equal to a maximum value of the first voltage.

The high voltage tolerant output circuit and the control chip described above can prevent internal components from enduring excessive voltage difference.

It is to be understood that both the foregoing general description and the following detailed description are by examples, and are intended to provide further explanation of the disclosure as claimed.

DETAILED DESCRIPTION

Figure 1:
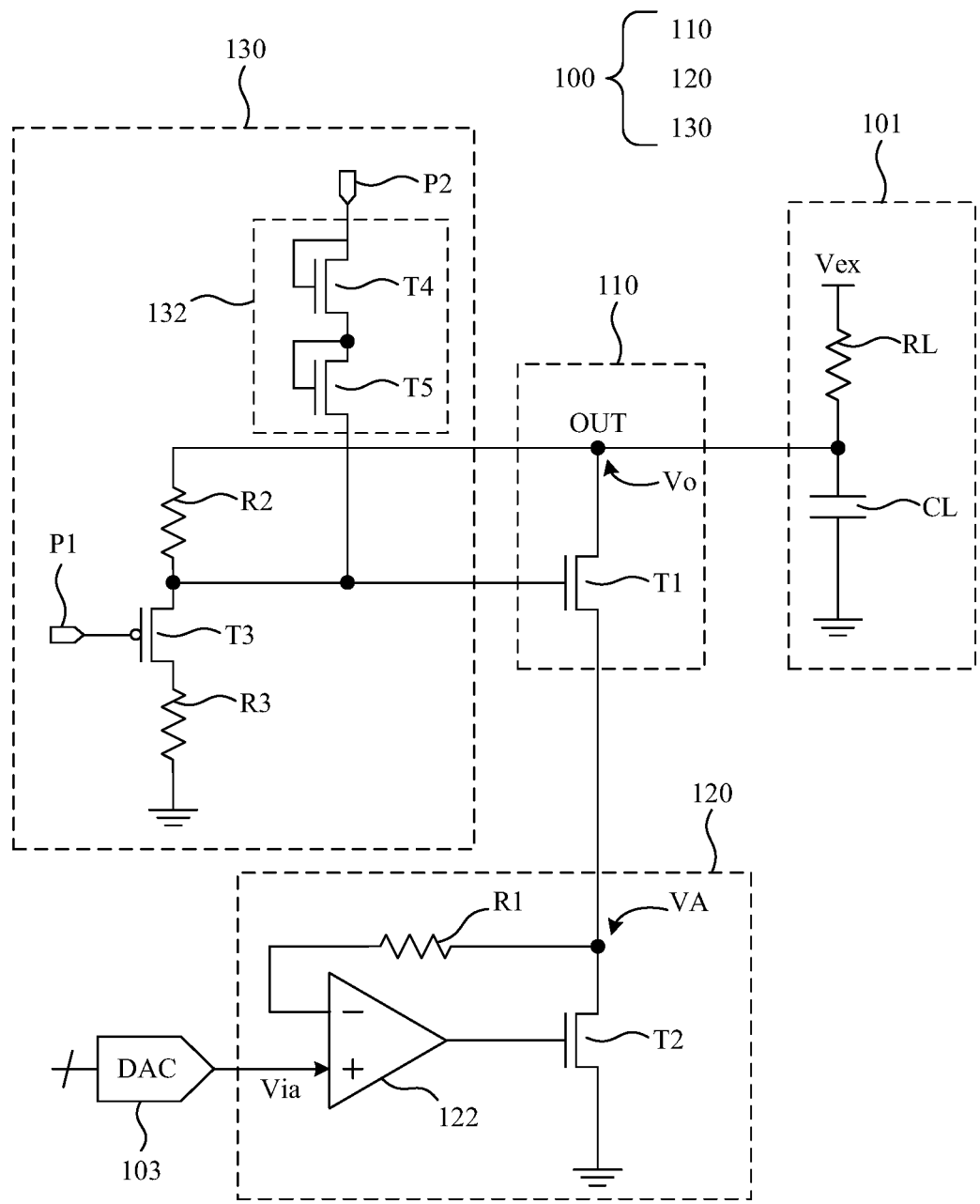
FIG. 1 is a function block diagram of high voltage tolerant output circuit, in accordance with an embodiment of the present disclosure.

The embodiments of the present disclosure will be described below in conjunction with related drawings. In the drawings, the same reference numerals indicate the same or similar elements or method process.

FIG. 1 is a function block diagram of a high voltage tolerant output circuit 100, in accordance with an embodiment of the present disclosure. The high voltage tolerant output circuit 100 comprises a boost circuit 110, a buffer circuit 120 and a first bias circuit 130. The boost circuit 110 comprises a first transistor T1 and an output node OUT, in which the first transistor T1 includes a first terminal, a second terminal and a control terminal, and the first terminal of the first transistor T1 is coupled to the output node OUT. The output node OUT is configured to provide an output voltage Vo, and configured to be coupled to an external device 101, in which the external device 101 comprises a load resistor RL and a load capacitor CL. An end of the load resistor RL is configured to be coupled to the output node OUT, and the other end of the load resistor RL is configured to receive an external voltage Vex.

The buffer circuit 120 is coupled to the second terminal of the first transistor T1, and configured to receive a first input voltage Via from a digital-to-analog converter (DAC) 103 and set a first voltage VA of the second terminal of the first transistor T1 according to the first input voltage Via. The first bias circuit 130 is coupled to the output node OUT and the control terminal of the first transistor T1, and configured to divide the output voltage Vo and provide the divided output voltage Vo to the control terminal of the first transistor T1. In this embodiment, the first transistor T1 may be operated in the saturation region such that the output voltage Vo is positively correlated to the first voltage VA, and a maximum value of the output voltage Vo may be greater than or equal to a maximum value of the first voltage VA.

Figure 5:
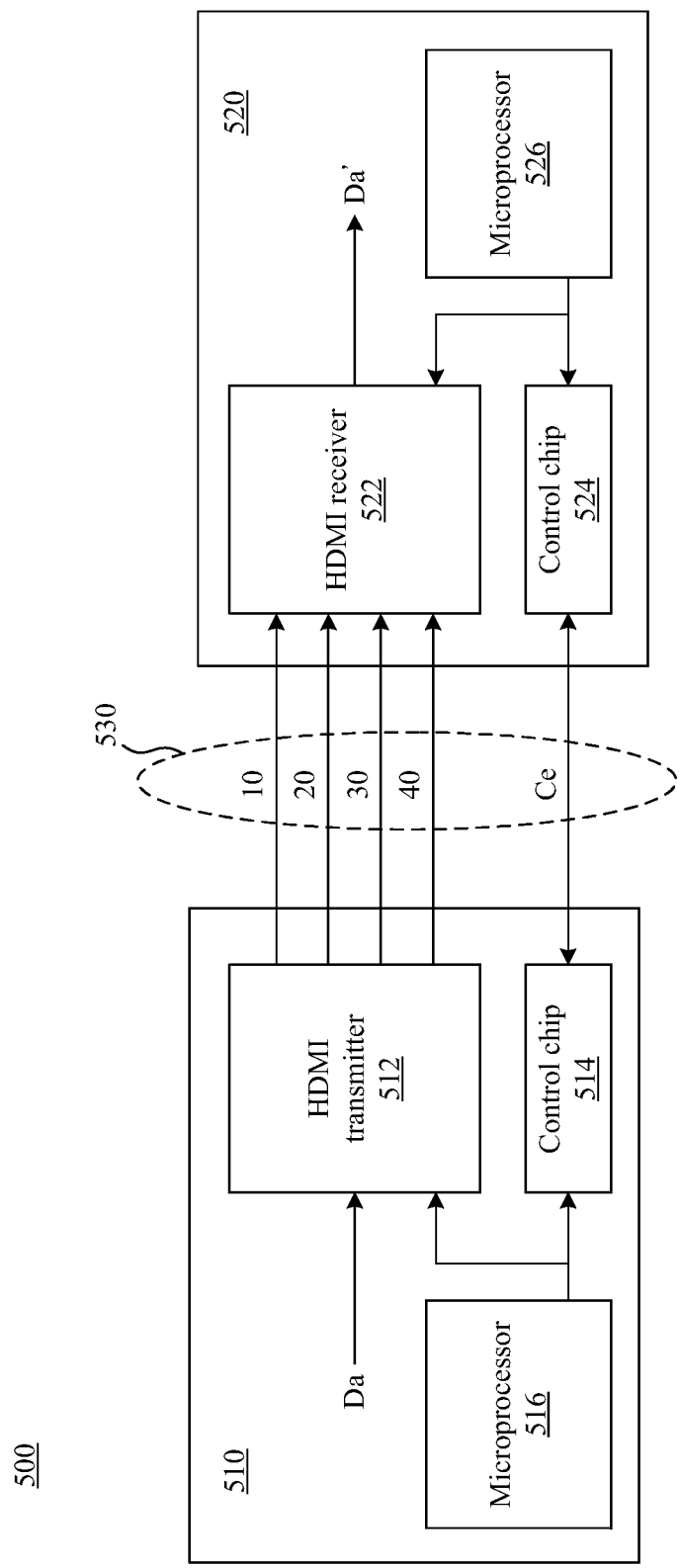
FIG. 5 is a function block diagram of simplified video and audio system, in accordance with an embodiment of the present disclosure.

In some embodiments, the high voltage tolerant output circuit 100 in FIG. 1 may be applied to a transmitter of a control chip 514 in FIG. 5, and the external device 101 in FIG. 1 may be part of circuit of another control chip 524 in FIG. 5. The control chip 514 and the control chip 524 support consumer electronics control (CEC) protocol, and the related detail will be explained separately in following paragraphs.

Reference is now made to FIG. 1. The buffer circuit 120 comprises a second transistor T2, an amplifier 122 and a first resistor R1. The second transistor T2 includes a first terminal, a second terminal and a control terminal, in which the first terminal of the second transistor T2 is coupled to the second terminal of the first transistor T1. The amplifier 122 includes a first terminal (e.g., noninverting input end), a second terminal (e.g., inverting input end) and an output terminal, in which the first terminal of the amplifier 122 is configured to receive the first input voltage Via. The first resistor R1 is coupled between the first terminal of the second transistor T2 and the second terminal of the amplifier 122. In some embodiments, the buffer circuit 120 may be a unit-gain buffer.

Based on virtual ground characteristics between the first terminal and the second terminal of the amplifier 122, the first input voltage Via is mirrored to the second terminal of the first transistor T1 as the first voltage VA. Since the output voltage Vo is positively correlated to the first voltage VA, the output voltage Vo is also positively correlated to the first input voltage Via, and the maximum value of the output voltage Vo may be greater than or equal to a maximum value of the first input voltage Via.

The first bias circuit 130 comprises a second resistor R2, a third resistor R3, a third transistor T3 and a pull-up circuit 132. The second resistor R2 is coupled between the output node OUT and the control terminal of the first transistor T1. The third transistor T3 includes a first terminal, a second terminal and a control terminal, the first and the second terminal of the third transistor T3 is coupled to the control terminal of the first transistor T1 and the third resistor R3 respectively, and the control terminal of the third transistor T3 is coupled to a first power supply terminal P1. The third resistor R3 is coupled between the second terminal of the third transistor T3 and a ground terminal.

The pull-up circuit 132 comprises a fourth transistor T4 and a fifth transistor T5. The fourth transistor T4 and the fifth transistor T5 each comprise a first terminal, a second terminal and a control terminal. The first terminal and the control terminal of the fourth transistor T4 are coupled to each other, the first terminal of the fourth transistor T4 is coupled to a second power supply terminal P2, and the second terminal of the fourth transistor T4 is coupled to the first terminal of the fifth transistor T5. The first terminal and the control terminal of the fifth transistor T5 are coupled to each other, and the second terminal of the fifth transistor T5 is coupled to the control terminal of the first transistor T1. In other words, the fourth transistor T4 and the fifth transistor T5 form a first diode-connected structure and a second diode-connected structure respectively, and the first diode-connected structure and the second diode-connected structure are coupled in series between the control terminal of the first transistor T1 and the second power supply terminal P2.

In practice, the first transistor T1, the second transistor T2, the fourth transistor T4 and the fifth transistor T5 may be implemented by various suitable N-type transistors. The third transistor T3 may be implemented by various suitable P-type transistors.

Figure 2:
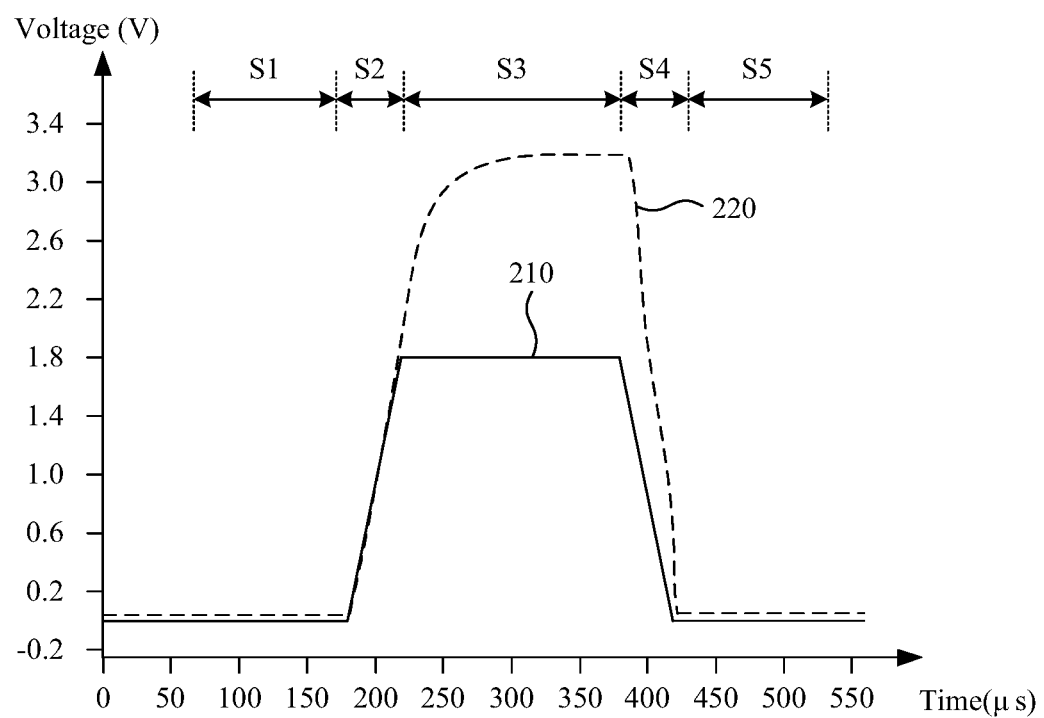
FIG. 2 is a schematic diagram of simulation of high voltage tolerant output circuit, in accordance with an embodiment of the present disclosure.

FIG. 2 is a schematic diagram of simulation of high voltage tolerant output circuit 100, in accordance with an embodiment of the present disclosure. A line segment 210 represents voltage waveform of the first input voltage Via, and a line segment 220 represents voltage waveform of the output voltage Vo. In this embodiment, the first input voltage Via may have a step waveform that gradually step up and step down, and may have a voltage range such as 0-1.8 V. For instance, if the DAC 103 is configured to receive a 5-bit input signal, then the first input voltage Via has 32 steps in the increasing process from 0 V to 1.8 V. To make the diagram concise, the first input voltage Via in the FIG. 2 is simplified as a square wave. The external voltage Vex may, for example, be 3.3 V, and the first power supply terminal P1 and the second power supply terminal P2 may provide a voltage input such as 1.8 V.

Reference is made to FIG. 1 in conjunction with FIG. 2. In a first phase S1 and a fifth phase S5, when the first input voltage Via (or the first voltage VA) has a valley value (e.g., 0 V), the first transistor T1 through the fifth transistor T5 are all conducted. The output voltage Vo is pull down to the ground voltage (e.g., 0 V) by the second transistor T2. The first bias circuit 130 may set the control terminal of the first transistor T1 to a first preset voltage (e.g., 1.6 V) by dividing the output voltage Vo and by the voltage input of the second power supply terminal P2.

In a second phase S2 and a fourth phase S4, when the first input voltage Via (or the first voltage VA) gradually increases or decreases, the first transistor T1 through the fifth transistor T5 are all conducted. Therefore, the output voltage Vo gradually increases or decreases corresponding to the first input voltage Via.

In a third phase S3, when the first input voltage Via (or first voltage VA) has a peak value (e.g., 1.8 V), the second transistor T2 is turned off such that the output voltage Vo is increased to be near to the external voltage Vex (e.g., 3.3 V). On the other hand, since the third transistor T3 remains conducted, the first bias circuit 130 may set the control terminal of the first transistor T1 to a second preset voltage (e.g., 2.2 V) through dividing the output voltage Vo. In this situation, the fourth transistor T4 and the fifth transistor T5 are turned off due to reverse bias.

Based on above, in a general operation mode, the high voltage tolerant output circuit 100 may utilize lower input voltage (e.g., 0-1.8 V) to provide an output voltage having a range (e.g. 0-3.3 V) comply with the CEC protocol specification. Furthermore, a source-drain voltage difference, a gate-source voltage difference, and a gate-drain voltage difference for each transistor in the high voltage tolerant output circuit 100 remain under 1.8 V in the whole operation process, so that each transistor in the high voltage tolerant output circuit 100 will not be damaged by excessive bias voltage. Therefore, the high voltage tolerant output circuit 100 may be implemented by advanced semiconductor process so as to reduce circuit layout area and save power.

In some situation, the first power supply terminal P1 and the second power supply terminal P2 stop providing voltage (or providing a voltage of 0 V) and the DAC 103 stops providing the first input voltage Via, but the external device 101 still keeps providing the external voltage Vex to the high voltage tolerant output circuit 100. For example, when a first video and audio device 510 is shut down but connected to a second video and audio device 520 which is still operating, the control chip 514 will keep receiving external voltage Vex from the control chip 524. In this situation, the output voltage Vo approaches to the external voltage Vex (e.g., 3.3 V), such that the third transistor T3 is conducted. The first bias circuit 130 divides the output voltage Vo such that the control terminal of the first transistor T1 is set to a third preset voltage (e.g., 2.2 V). Therefore, the first transistor T1 is conducted, and the fourth transistor T4 and the fifth transistor T5 are turned off. Since the second transistor T2 is also turned off, the first voltage VA (e.g., 1.8 V) is equal to the third preset voltage minus a threshold voltage of the first transistor T1.

Based on above, even when losing power supplies, the source-drain voltage difference, the gate-source voltage difference, and the gate-drain voltage difference for each transistor in the high voltage tolerant output circuit 100 remain under 1.8 V, such that the high voltage tolerant output circuit 100 has high reliability.

Figure 3:
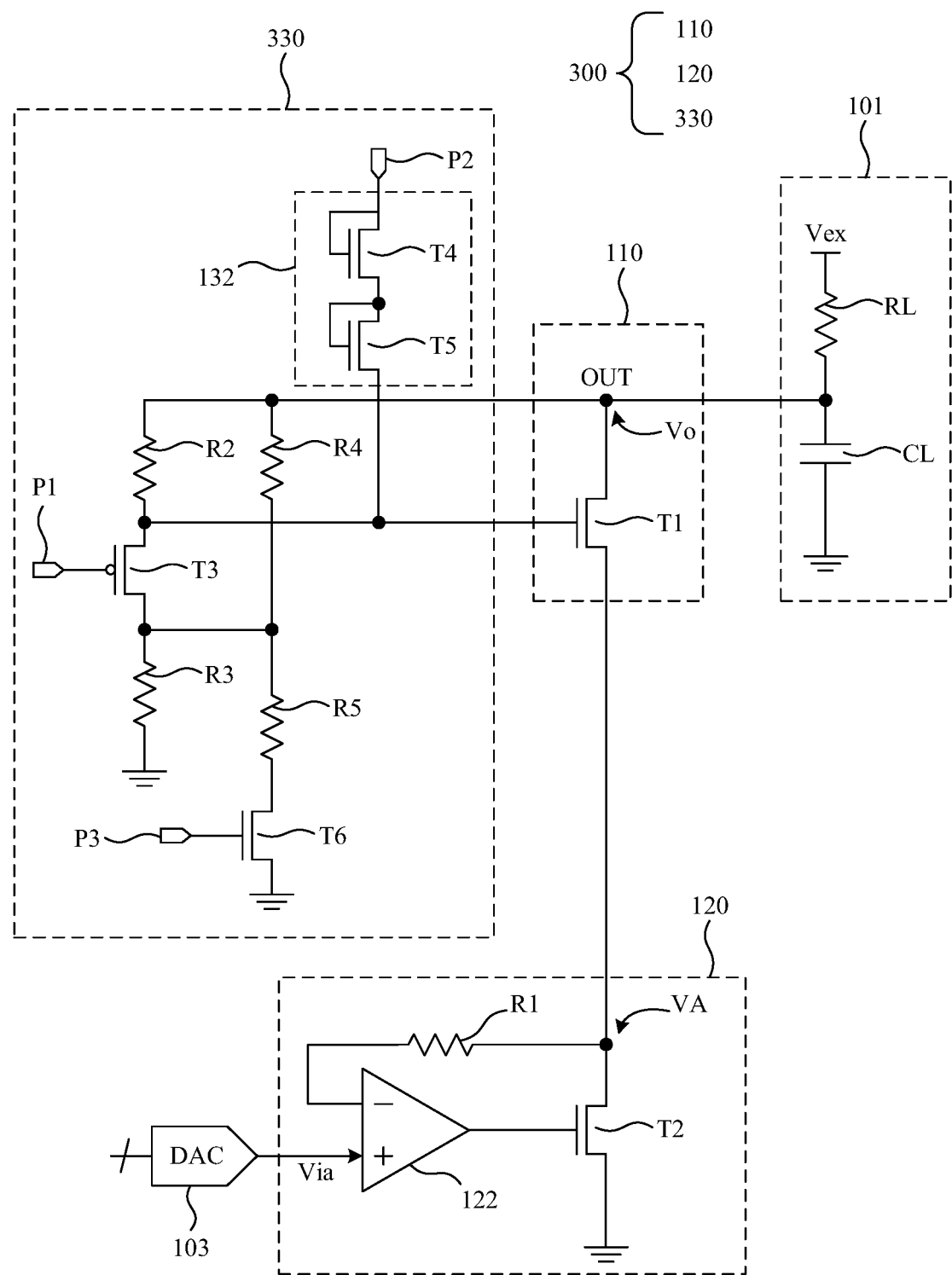
FIG. 3 is a function block diagram of high voltage tolerant output circuit, in accordance with another embodiment of the present disclosure.

FIG. 3 is a function block diagram of a high voltage tolerant output circuit 300, in accordance with an embodiment of the present disclosure. The high voltage tolerant output circuit 300 is similar to the high voltage tolerant output circuit 100 in FIG. 1. The difference is that a first bias circuit 330 of the high voltage tolerant output circuit 300 comprises not only the third transistor T3, the fourth transistor T4, the fifth transistor T5, the second resistor R2 and the third resistor R3 aforementioned, but also a fourth resistor R4, a fifth resistor R5 and a sixth transistor T6. The fourth resistor R4 is coupled between the output node OUT and the second terminal of the third transistor T3. The fifth resistor R5 is coupled between the second terminal of the third transistor T3 and the sixth transistor T6. The sixth transistor T6 comprises a first terminal, a second terminal and a control terminal. The first terminal of the sixth transistor T6 is coupled to the fifth resistor R5, the second terminal of the sixth transistor T6 is coupled to the ground terminal, and the control terminal of the sixth transistor T6 is coupled to a third power supply terminal P3. In some embodiments, the third power supply terminal P3 may provide a voltage input of 1.8 V in the aforementioned first phase S1 through fifth phase S5.

The fourth resistor R4, the fifth resistor R5 and the sixth transistor T6 may decide voltage of the second terminal of the third transistor T3 by dividing the output voltage Vo, thereby helping stabilize voltage of the control terminal of the first transistor T1. In practice, the sixth transistor T6 may be implemented by various suitable N-type transistors.

Figure 4:
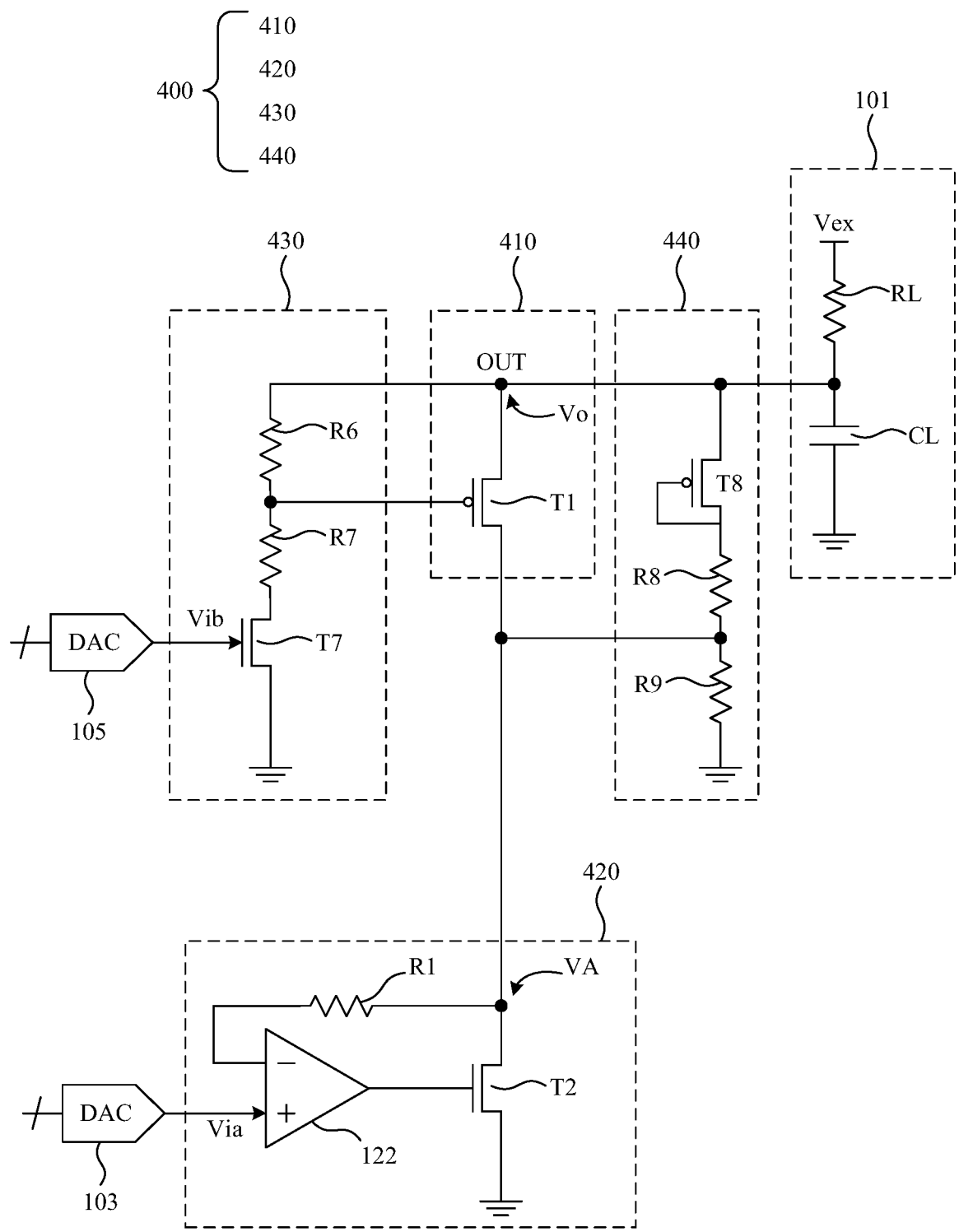
FIG. 4 is a function block diagram of high voltage tolerant output circuit, in accordance with yet another embodiment of the present disclosure.

FIG. 4 is a function block diagram of a high voltage tolerant output circuit 400, in accordance with an embodiment of the present disclosure. The high voltage tolerant output circuit 400 comprises a boost circuit 410, a buffer circuit 420, a first bias circuit 430 and a second bias circuit 440. The boost circuit 410 and the buffer circuit 420 are similar to the boost circuit 110 and the buffer circuit 120 in FIG. 1 respectively. The difference is that the first transistor T1 of the boost circuit 410 is implemented by a P-type transistor.

The first bias circuit 430 comprises a sixth resistor R6, a seventh resistor R7 and a seventh transistor T7, in which the seventh transistor T7 may be implemented by a N-type transistor. The sixth resistor R6 is coupled between the output node OUT and the control terminal of the first transistor T1. The seventh resistor R7 is coupled between the control terminal of the first transistor T1 and the seventh transistor T7. The seventh transistor T7 comprises a first terminal, a second terminal and a control terminal. The first terminal and the second terminal of the seventh transistor T7 are coupled to the seventh resistor R7 and the ground terminal respectively. The control terminal of the seventh transistor T7 receives a second input voltage Vib from a digital analog converter 105, in which the first input voltage Via and the second input voltage Vib may be opposite to each other.

Therefore, when the first input voltage Via is between the peak value (e.g., 1.8 V) and the valley value (e.g., 0 V), the seventh transistor T7 is conducted such that voltage of the gate electrode of the first transistor T1 is pulled down, and then the first transistor T1 is conducted. In this situation, the output voltage Vo is then positively correlated to the first input voltage Via.

The second bias circuit 440 comprises an eighth transistor T8, an eighth resistor R8 and a ninth resistor R9, in which the eighth transistor T8 may be implemented by a P-type transistor. The eighth transistor T8 comprises a first terminal, a second terminal and a control terminal. The first terminal of the eighth transistor T8 is coupled to the output node OUT. The second terminal and the control terminal of the eighth transistor T8 are coupled to each other. The eighth resistor R8 is coupled between the second terminal of the eighth transistor T8 and the second terminal of the first transistor T1. The ninth resistor R9 is coupled between the second terminal of the first transistor T1 and the ground terminal. In a situation that the high voltage tolerant output circuit 400 loses power supplies and the external device 101 keeps providing the external voltage Vex, the second bias circuit 440 may set the first voltage VA as a fourth preset voltage (e.g., 1.8 V) by dividing the output voltage Vo in order to protect the first transistor T1.

The other connections, components, implementations and advantages of the high voltage tolerant output circuit 100 aforementioned are all applicable to the high voltage tolerant output circuit 400. For the sake of brevity, those descriptions will not be repeated here.

FIG. 5 is a function block diagram of simplified video and audio system 500, in accordance with an embodiment of the present disclosure. The video and audio system 500 comprises a first video and audio device 510, a second video and audio device 520 and a high definition multimedia interface (HDMI) cable 530, in which the first video and audio device 510 and the second video and audio device 520 are communicatively coupled to each other through the HDMI cable 530. For the sake of brevity, the remaining components and connections of the video and audio system 500 are not shown in FIG. 5.

The first video and audio device 510 comprises a HDMI transmitter 512, the control chip 514 and a microprocessor 516. The second video and audio device 520 comprises a HDMI receiver 522, the control chip 524 and a microprocessor 526, in which the control chip 514 and the control chip 524 support the CEC communication protocol. The HDMI transmitter 512 is configured to encode an audio/video signal Da, and transmit the audio/video signal Da to the HDMI receiver 522 through time minimized differential signal (TMDS) data channels 10, 20 and 30. The HDMI transmitter 512 is further configured to transmit a clock signal to ensure that the data transmission is synchronized through a TMDS clock channel 40. The HDMI receiver 522 may decode data received from the TMDS data channels 10, 20 and 30 to an audio/video signal Da'. The high voltage tolerant output circuits 100, 300 and 400 in the aforementioned embodiments may be disposed in the control chips 514 and 524, and configured to output CEC signal Ce. If the high voltage tolerant output circuits 100, 300 and 400 are disposed in the control chip 514, the control chip 524 then corresponds to the external device 101 in FIG. 1, and vice versa.

Different function blocks in the first video and audio device 510 and the second video and audio device 520 may be implemented by different circuits respectively, or be integrated in a single circuit chip. For instance, the HDMI transmitter 512 and the control chip 514 of the first video and audio device 510 may be integrated in a single chip, and the HDMI receiver 522 and the control chip 524 of the second video and audio device 520 may be integrated in a single chip.

In some embodiments, the first video and audio device 510 may be a laptop, a DVD player or a game console, and the second video and audio device 520 may be a television or acoustic sets.

Certain terms used in the specification and the scope of the patent application are referred to specific elements. However, those skilled in the art should understand that the same element may be referred to different terms. The specification and the scope of the patent application should not use the difference in terms as a way of distinguishing elements, but the difference in function of elements. The terms "including", "comprising", "having", "containing" and the like, as used herein, are all open-ended terms, meaning "including but not limited to". In addition, the term "coupling" as used herein, includes any direct and indirect connection means. Therefore, if it is described in the text that the first element is coupled to the second element, it means that the first element may be directly connected to the second element through electrical connection, wireless transmission, optical transmission, or other signal connections, or may be electrically connected to the second element indirectly, through other elements or connection means.

Furthermore, any term in the singular case also includes the meaning of the plural case, unless otherwise specified in the specification.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A high voltage tolerant output circuit comprising:
   a boost circuit, comprising a first transistor and an output node, wherein a first terminal of the first transistor is coupled to the output node;
   a first bias circuit, coupled to the output node and a control terminal of the first transistor, configured to divide an output voltage of the output node, and configured to provide the output voltage divided by the first bias circuit to the control terminal of the first transistor; and
   a buffer circuit, coupled to a second terminal of the first transistor, configured to set a first voltage of the second terminal of the first transistor according to an input voltage, wherein the output voltage is positively correlated to the first voltage, and a maximum value of the output voltage is greater than or equal to a maximum value of the first voltage;
   wherein when the input voltage is no longer being provided, the first bias circuit is configured to receive an external voltage by the output node, and is configured to divide the external voltage to conduct the first transistor.

2. The high voltage tolerant output circuit of claim 1, wherein the buffer circuit comprises:
   a second transistor, wherein a first terminal of the second transistor is coupled to the second terminal of the first transistor;
   an amplifier comprising a first terminal, a second terminal and an output terminal, wherein the output terminal of the amplifier is coupled to the control terminal of the second transistor, and the first terminal of the amplifier is configured to receive a first input signal; and
   a first resistor, coupled between the first terminal of the second transistor and the second terminal of the amplifier.

3. The high voltage tolerant output circuit of claim 2, wherein when the input signal has a peak value, the second transistor is turned off, and when the input signal has a valley value, the second transistor is conducted.

4. The high voltage tolerant output circuit of claim 2, wherein the first bias circuit comprises:
   a second resistor coupled between the output node and the control terminal of the first transistor;
   a third resistor;
   a third transistor coupled between the control terminal of the first transistor and the third resistor, and coupled to a ground terminal through the third resistor, wherein a control terminal of the third transistor is coupled to a first power supply terminal; and
   a pull-up circuit coupled between the control terminal of the first transistor and a second power supply terminal.

5. The high voltage tolerant output circuit of claim 4, wherein the pull-up circuit comprises:
   a fourth transistor formed a first diode-connected structure; and
   a fifth transistor formed a second diode-connected structure, wherein the first diode-connected structure and the second diode-connected structure are coupled between the control terminal of the first transistor and the second power supply terminal in series.

6. The high voltage tolerant output circuit of claim 4, wherein the first bias circuit further comprises:
   a fourth resistor coupled between the output node and the second terminal of the second transistor;
   a fifth resistor coupled to the second terminal of the second transistor; and
   a sixth transistor, wherein a first terminal of the sixth transistor is coupled to the fifth resistor, a second terminal of the sixth transistor is coupled to the ground terminal, and a control terminal of the sixth transistor is coupled to a third power supply terminal.

7. The high voltage tolerant output circuit of claim 2, wherein the high voltage tolerant output circuit further comprises:
   a second bias circuit coupled between the output node and the second terminal of the first transistor, configured to divide the output voltage and provide the output voltage divided by the second bias circuit to the second terminal of the first transistor.

8. The high voltage tolerant output circuit of claim 7, wherein the first bias circuit comprises:
   a sixth resistor coupled between the output node and the control terminal of the first transistor;
   a seventh resistor coupled to the control terminal of the first transistor; and
   a seventh transistor coupled between the seventh resistor and a ground terminal.

9. The high voltage tolerant output circuit of claim 8, wherein when the input signal has a peak value, the seventh transistor is turned off, and when the input signal has a valley value, the seventh transistor is conducted.

10. The high voltage tolerant output circuit of claim 8, wherein the second bias circuit comprises:
- an eighth transistor, wherein a first terminal of the eighth transistor is coupled to the output node, and a second terminal of the eighth transistor is coupled to a control terminal of the eighth transistor;
- an eighth resistor coupled between the second terminal of the eighth transistor and the second terminal of the first transistor; and
- a ninth resistor coupled between the second terminal of the first transistor and the ground terminal.

11. A control chip, supporting consumer electronics control protocol, comprising a high voltage tolerant output circuit, wherein the high voltage tolerant output circuit comprises:
- a boost circuit, comprising a first transistor and an output node, wherein a first terminal of the first transistor is coupled to the output node;
- a first bias circuit, coupled to the output node and a control terminal of the first transistor, configured to divide an output voltage of the output node, and configured to provide the output voltage divided by the first bias circuit to the control terminal of the first transistor; and
- a buffer circuit, coupled to a second terminal of the first transistor, configured to set a first voltage of the second terminal of the first transistor according to an input voltage, wherein the output voltage is positively correlated to the first voltage, and a maximum value of the output voltage is greater than or equal to a maximum value of the first voltage;
- wherein when the input voltage is no longer being provided, the first bias circuit is configured to receive an external voltage by the output node, and is configured to divide the external voltage to conduct the first transistor.

12. The control chip of claim 11, wherein the buffer circuit comprises:
- a second transistor, wherein a first terminal of the second transistor is coupled to the second terminal of the first transistor;
- an amplifier comprising a first terminal, a second terminal and an output terminal, wherein the output terminal of the amplifier is coupled to the control terminal of the second transistor, and the first terminal of the amplifier is configured to receive a first input signal; and
- a first resistor, coupled between the first terminal of the second transistor and the second terminal of the amplifier.

13. The control chip of claim 12, wherein when the input signal has a peak value, the second transistor is turned off, and when the input signal has a valley value, the second transistor is conducted.

14. The control chip of claim 12, wherein the first bias circuit comprises:
- a second resistor coupled between the output node and the control terminal of the first transistor;
- a third resistor;
- a third transistor coupled between the control terminal of the first transistor and the third resistor, and coupled to a ground terminal through the third resistor, wherein a control terminal of the third transistor is coupled to a first power supply terminal; and
- a pull-up circuit coupled between the control terminal of the first transistor and a second power supply terminal.

15. The control chip of claim 14, wherein the pull-up circuit comprises:
- a fourth transistor formed a first diode-connected structure; and
- a fifth transistor formed a second diode-connected structure, wherein the first diode-connected structure and the second diode-connected structure are coupled between the control terminal of the first transistor and the second power supply terminal in series.

16. The control chip of claim 14, wherein the first bias circuit further comprises:
- a fourth resistor coupled between the output node and the second terminal of the second transistor;
- a fifth resistor coupled to the second terminal of the second transistor; and
- a sixth transistor, wherein a first terminal of the sixth transistor is coupled to the fifth resistor, a second terminal of the sixth transistor is coupled to the ground terminal, and a control terminal of the sixth transistor is coupled to a third power supply terminal.

17. The control chip of claim 12, wherein the high voltage tolerant output circuit further comprises:
- a second bias circuit, coupled between the output node and the second terminal of the first transistor, configured to divide the output voltage and provide the output voltage divided by the second bias circuit to the second terminal of the first transistor.

18. The control chip of claim 17, wherein the first bias circuit comprises:
- a sixth resistor coupled between the output node and the control terminal of the first transistor;
- a seventh resistor coupled to the control terminal of the first transistor; and
- a seventh transistor coupled between the seventh resistor and a ground terminal.

19. The control chip of claim 18, wherein when the input signal has a peak value, the seventh transistor is turned off, and when the input signal has a valley value, the seventh transistor is conducted.

20. The control chip of claim 18, wherein the second bias circuit comprises:
- an eighth transistor, wherein a first terminal of the eighth transistor is coupled to the output node, and a second terminal of the eighth transistor is coupled to a control terminal of the eighth transistor;
- an eighth resistor coupled between the second terminal of the eighth transistor and the second terminal of the first transistor; and
- a ninth resistor coupled between the second terminal of the first transistor and the ground terminal.

* * * * *